(12) United States Patent
Fujiuchi et al.

(10) Patent No.: US 10,348,924 B2
(45) Date of Patent: Jul. 9, 2019

(54) LIGHT-RECEIVING UNIT AND IMAGE SENSOR

(71) Applicant: Mitsubishi Electric Corporation, Chiyoda-ku (JP)

(72) Inventors: Akiko Fujiuchi, Chiyoda-ku (JP);
Shunsuke Takatori, Kashihara (JP);
Masaaki Okada, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/752,736

(22) PCT Filed: Dec. 15, 2016

(86) PCT No.: PCT/JP2016/087412
§ 371 (c)(1),
(2) Date: Feb. 14, 2018

(87) PCT Pub. No.: WO2017/104756
PCT Pub. Date: Jun. 22, 2017

(65) Prior Publication Data
US 2018/0249035 A1    Aug. 30, 2018

(30) Foreign Application Priority Data

Dec. 16, 2015    (JP) .................................. 2015-245201

(51) Int. Cl.
*H04N 1/19* (2006.01)
*G06T 1/00* (2006.01)
(Continued)

(52) U.S. Cl.
CPC ................. *H04N 1/19* (2013.01); *G06T 1/00* (2013.01); *H01L 27/14* (2013.01);
(Continued)

(58) Field of Classification Search
CPC .... H04N 1/19; H04N 1/1903; H04N 1/00795; H04N 1/028; H01L 27/14
(Continued)

(56) References Cited

U.S. PATENT DOCUMENTS

2006/0238631 A1    10/2006  Ligozat et al.
2012/0261556 A1*   10/2012  Abe ..................... H04N 1/0311
                                                 250/208.1
(Continued)

FOREIGN PATENT DOCUMENTS

JP    2009-514257 A    4/2009
JP    2013-150310 A    8/2013
(Continued)

OTHER PUBLICATIONS

International Search Report dated Feb. 14, 2017 in PCT/JP2016/087412 filed Dec. 15, 2016.
(Continued)

*Primary Examiner* — Jamares Q Washington
(74) *Attorney, Agent, or Firm* — Oblon, McClelland, Maier & Neustadt, L.L.P.

(57) ABSTRACT

A light receiving unit including: a sensor board assembly on which plural sensor tips are arrayed in a line in a longitudinal direction of the sensor board and mounted on the sensor board; and a sensor plate on which plural of the sensor board assemblies are arrayed and mounted in a line in the longitudinal direction. The sensor chips include plural pixels formed in a line in the longitudinal direction. At longitudinal ends of the sensor board assembly, the sensor chips protrude outward in the longitudinal direction from the longitudinal ends. Between the facing sensor chips of the adjacent sensor board assemblies, the facing sensor chips mounted at the longitudinal ends, the ends of the facing sensor chips are spaced at a predetermined interval. The sensor board (Continued)

includes convex portions, at the longitudinal ends, protruding in the longitudinal direction. The sensor chips are mounted at the convex portion.

20 Claims, 16 Drawing Sheets

(51) Int. Cl.
  *H01L 27/14* (2006.01)
  *H04N 1/028* (2006.01)
  *H04N 1/00* (2006.01)
  *H01L 27/146* (2006.01)
(52) U.S. Cl.
  CPC ... *H01L 27/14618* (2013.01); *H04N 1/00795* (2013.01); *H04N 1/028* (2013.01)
(58) Field of Classification Search
  USPC ..... 358/1.4, 1.8, 525; 347/130, 138, 238, 49
  See application file for complete search history.

(56) References Cited

U.S. PATENT DOCUMENTS

| 2013/0163021 A1 | 6/2013 | Kinoshita |
| 2013/0163057 A1* | 6/2013 | Mihara ................. H04N 1/028 358/482 |
| 2014/0376061 A1 | 12/2014 | Kato et al. |

FOREIGN PATENT DOCUMENTS

| JP | 2013-150311 A | 8/2013 |
| JP | 2014-79017 A | 5/2014 |
| JP | 2015-5827 A | 1/2015 |

OTHER PUBLICATIONS

Notification of Reasons for Refusal dated Jun. 6, 2017 in Japanese Patent Application No. 2017-525126 (with English language translation).

* cited by examiner

LIGHT-RECEIVING UNIT AND IMAGE SENSOR

TECHNICAL FIELD

The present disclosure relates to a light receiving unit and an image sensor used for a reading device that reads a reading object.

BACKGROUND ART

In recent years, an image scanner for large reading objects is needed in the image scanner market. In order to read an image of a large reading object, a sensor is required to be elongated in a reading direction (main scanning direction). With elongation of the sensor, use of a single board for mounting a light receiving element sensor chip becomes difficult. Therefore a structure in which short length boards arrayed in a line in the reading direction is required. Small size and high accuracy of mounting distances between adjacent sensor chips of the array of sensor chips and sensor boards are important for minimizing missing portions of the reading image and increasing image quality.

Image scanners on which sensor chips are highly accurately mounted are, for example, those disclosed in Patent Literature 1 through 3. Patent Literature 1 discloses an image scanner that adjusts positions of a plurality of sensor boards. Patent Literature 2 discloses an image scanner including connection means for connecting sensor boards together to prevent damaging of a sensor chip. Patent Literature 3 discloses an image scanner in which two adjacent sensor boards are overlapped in a thickness direction to prevent damaging of a sensor chip.

CITATION LIST

Patent Literature

Patent Literature 1: Unexamined Japanese Patent Application Kokai Publication No. 2013-150311
Patent Literature 2: Unexamined Japanese Patent Application Kokai Publication No. 2013-150310
Patent Literature 3: Unexamined Japanese Patent Application Kokai Publication No. 2015-5827

SUMMARY OF INVENTION

Technical Problem

However, the image scanners disclosed in Patent Literatures 1 through 3 have a problem in that high accuracy in arraying of the sensor chips is difficult between the sensor boards.

The present disclosure is achieved to solve the above-mentioned problem, and is to provide a light receiving unit and an image sensor in which the arraying of the sensor chips between the sensor boards is highly accurate.

Solution to Problem

A light receiving unit and an image sensor according to the present disclosure include:

a sensor board assembly on which a plurality of sensor chips are arrayed in a line in a longitudinal direction of a sensor board and are mounted on the sensor board; and a sensor plate on which a plurality of the sensor board assemblies are arrayed and mounted in a line in the longitudinal direction;

wherein each sensor chip of the plurality of sensor chips includes a plurality of pixels formed in a line in the longitudinal direction;

at the longitudinal end of the sensor board assembly, the sensor chip protrudes outward of the sensor board in the longitudinal direction from the longitudinal ends of the sensor board;

facing sensor chips of the plurality of sensor chips mounted at the longitudinal ends of the adjacent sensor board assemblies are positioned so that ends of the facing sensor chips are spaced at a predetermined interval;

the sensor board includes convex portions protruding in the longitudinal direction at the longitudinal ends; and the sensor chips are mounted on the convex portions, wherein the sensor board assembly is mounted on the sensor plate by aligning a position of the convex portion of the sensor board with a position adjustment portion disposed on the sensor plate.

Advantageous Effects of Invention

According to the present disclosure, a light receiving unit and an image sensor, in which the sequence of the sensor chip is highly accurate, can be obtained by forming a sensor chip on convex portions that protrude from sensor boards in the longitudinal direction and adjusting positions of the sensor boards using the convex portions of the sensor boards.

DESCRIPTION OF EMBODIMENTS

Embodiment 1

Figure 1:
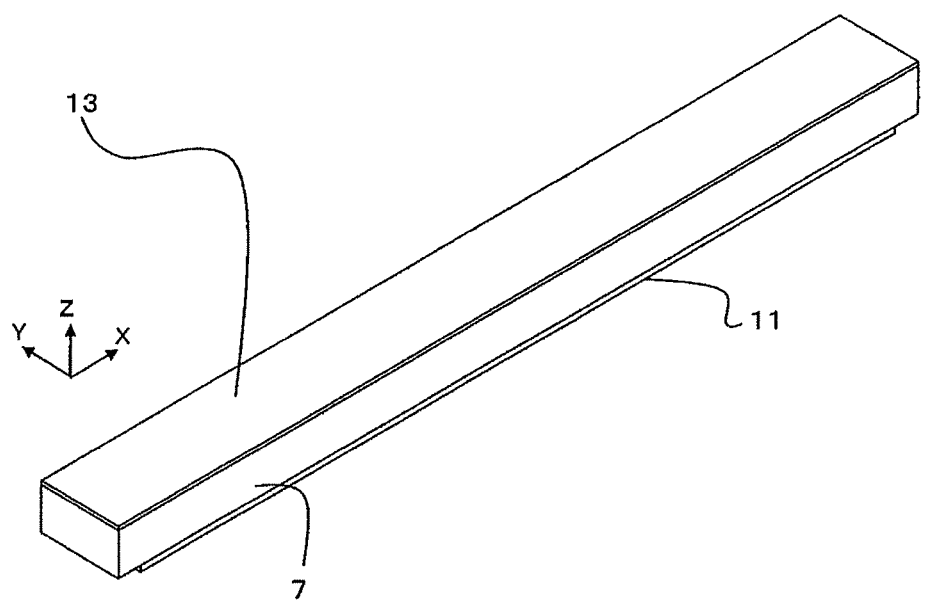
FIG. 1 is an external view of an image sensor according to Embodiment 1 of the present disclosure.

An image sensor according to Embodiment 1 of the present disclosure and a manufacturing process thereof are described using drawings. In Embodiment 1, conveyance of a reading object includes a case in which the image sensor itself is conveyed with respect to the reading object in addition to a case in which the reading object itself is conveyed.

In the drawings in Embodiment 1, there are three axes denoted by X, Y, and Z, that are perpendicular to one another. X indicates an X-axis, and indicates a main scanning direction of the image sensor (longitudinal direction of the image sensor). Y indicates a Y-axis, and indicates a sub-scanning direction of the image sensor (conveyance direction of the reading object, lateral direction of the image sensor). Z indicates a Z-axis, and indicates a depth of focus direction of the image sensor (thickness direction of the image sensor). The X-axis, the Y-axis, the Z-axis are perpendicular to one another. The origin of the X-axis is assumed to be the center of the length of the image sensor in the main scanning direction. The origin of the Y-axis is assumed to be the center of the image sensor in the sub-scanning direction. The origin of the Z-axis is assumed to be a surface of a transparent board 13 mentioned later. Furthermore, in Embodiment 1, a reading width of the image sensor is assumed to indicate the length of the reading area of the image sensor in the main scanning direction. In the drawings, the same reference symbol illustrates the same or an equivalent component.

Figure 2:
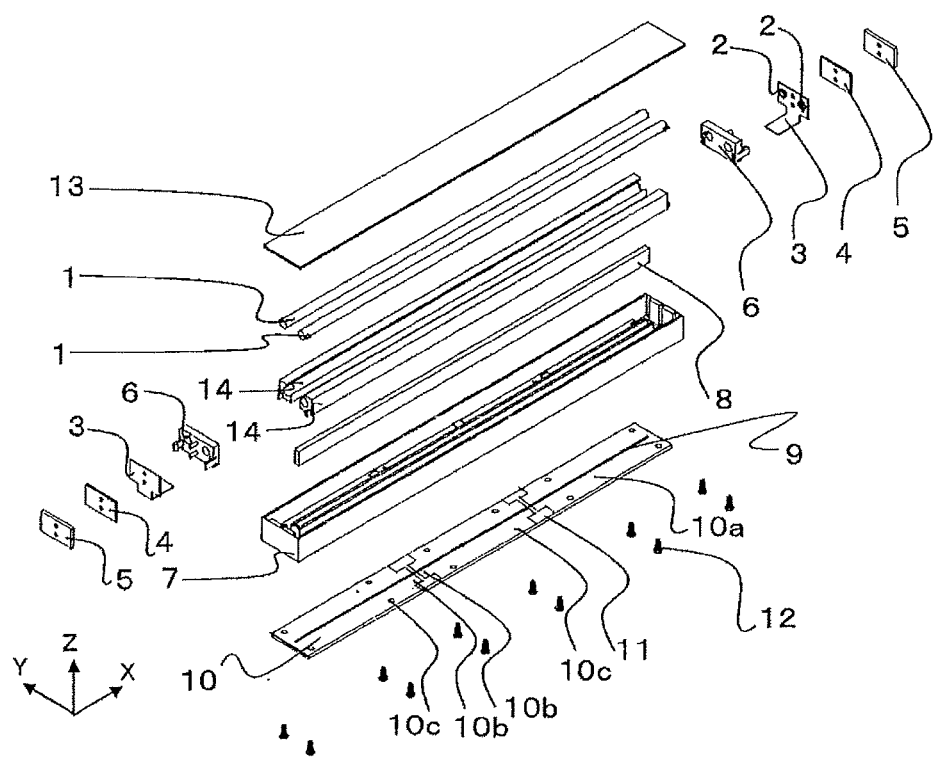
FIG. 2 is an exploded view of the image sensor according to Embodiment 1 of the present disclosure.
Figure 3:
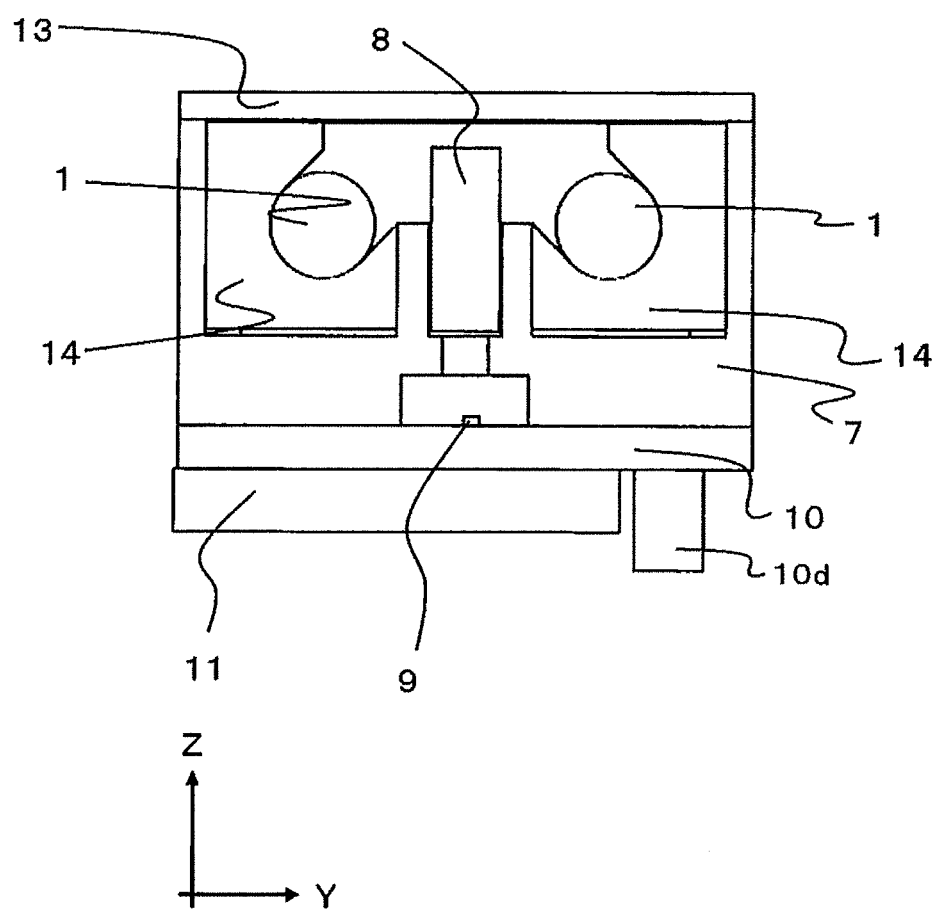
FIG. 3 is a YZ-plane cross section view of the image sensor according to Embodiment 1 of the present disclosure.

A configuration of the image sensor according to Embodiment 1 is described in reference to FIGS. 1 through 3. A light guide 1 is formed of transparent resin, and extends in the longitudinal direction ("the longitudinal direction of the light guide" corresponds to the main scanning direction of the image sensor). The light guide 1 is columnar, and has a cylindrical side shape, and the end face thereof in the longitudinal direction is circular. The side shape of the light guide 1 is not limited to a cylinder, and the end face of the light guide 1 in the longitudinal direction is not limited to a circle shape.

A light source 2 is a light source element such as an LED light source emitting light into at least one end face of the light guide 1 in the longitudinal direction. The light source 2 may be arranged on the other end face of the light guide 1 in the longitudinal direction. Light-emitting surfaces of each light source 2 are arranged facing to the longitudinal end faces of the light guide 1. The light source 2 includes a fixing member and a terminal for driving the light source drive on the back side of the light-emitting surface.

A light source board 3 is a board for fixing and driving the light source 2, and is a resin board such as a plate-like glass epoxy board or a metal board using a metal such as plate-like aluminum or copper, and the light source board 3 extends in the YZ plane direction. The light source board 3 includes a metal pad that corresponds to the terminal of the light source 2, and the light source 2 is fixed to the light source board 3 with an adhesive, by soldering, or the like. The light source board 3 includes a heat radiating surface on the back side of the light source 2 fixing surface.

A heat dissipation sheet 4 is arranged to contact the heat radiating surface of the light source board 3, is formed of a sheet-like heat conductor having a high heat conductivity, and extends in the YZ plane direction.

A heat dissipation board 5 is a plate-like or a block-like board made of good heat dissipation material such as sheet metal. The heat dissipation board 5 is attached at the back surface of the contact surface to the light source board 3 of the heat dissipation sheet 4 to increase thermal radiation performance. In addition, naturally, the heat dissipation board 5 can improve heat dissipation by forming a fin structure on a surface other than the attachment surface to the heat dissipation sheet 4.

A holder 6 is a block-shaped and made of easily formable material such as resin. The holder 6 includes a hole to hold the light guide 1 at the end face in the X direction. In addition, the holder 6 includes a holding mechanism for overlapping and fixing the light source board 3, the heat dissipation sheet 4, and the heat dissipation board 5 in the X direction on the back side of the end face in the X direction.

A housing 7 is a frame made of easily formable material such as resin or metal. The housing 7 includes a slit on the central portion in the Y direction extending in the X direction. In addition, the housing 7 includes a step at one end face in the Z direction supporting the transparent board 13 and another step at the other end face in the Z direction supporting a sensor plate 11.

An imaging element 8 is an arrayed optical member (for example, rod lens array, microlens array and the like) that collects and images the image information from a reading object, or a combination of a plurality of optical members (for example, an imaging optical system in which a group of mirrors and a lens are combined). An optical axis of one lens is arranged in the Z direction, and the array expands in the X direction. The imaging element 8 is described as a rod lens array in Embodiment 1. The rod lens array is multiple erecting equal-magnification rod lenses that are arrayed in the main scanning direction of the image sensor and fixed by the frame. For simplicity, only a box-like external shape elongated in the main scanning direction is illustrated for Embodiment 1.

Figure 5:
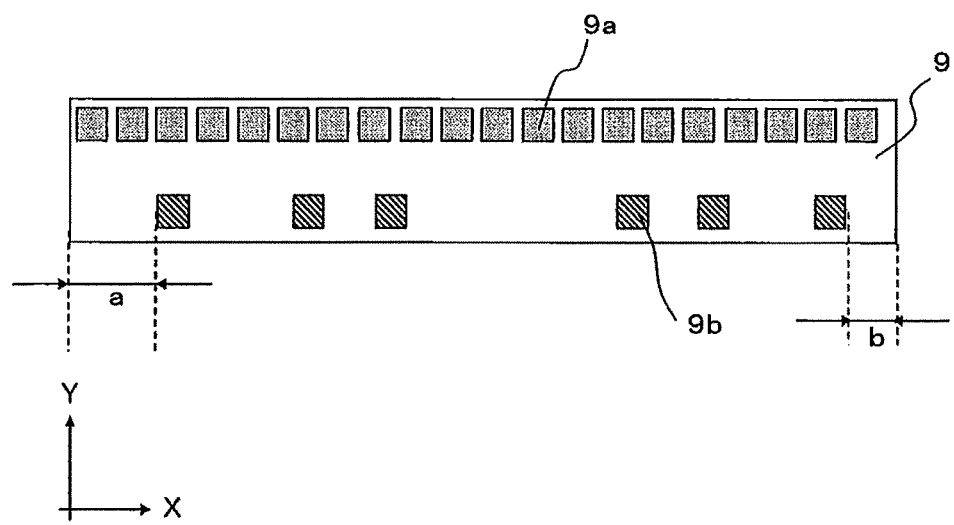
FIG. 5 is a drawing illustrating a sensor chip according to Embodiment 1 of the present disclosure.

As illustrated in FIG. 5, a sensor chip 9 is a plate-like light receiving element, extends in the XY plane direction, and has a function for converting light into an electrical signal. FIG. 5 is a drawing illustrating a sensor chip according to Embodiment 1. On the sensor chip 9, pixels 9a that convert light into an electrical signal are arranged in a line in the X direction, that is, in the longitudinal direction ("the longitudinal direction of the sensor chip 9" corresponds to the main scanning direction of the image sensor). At least one line of the pixels 9a disposed in a line is arranged, and a plurality of lines, as may be required, is arranged in parallel in the Y direction. For simplicity, only the box-like external shape elongated in the main scanning direction is illustrated for Embodiment 1. In addition, a plurality of electrical connection pads 9b that carries the electrical signal that is converted from the light received at the pixel 9a out of the sensor chip 9 at a position separated from the linearly formed pixels 9a in the Y direction, that is, in the lateral direction ("the lateral direction of the sensor chip 9" corresponds to the sub-scanning direction of the image sensor).

A sensor board 10 and the sensor plate 11 fixing the sensor board 10 are described in detail in reference to FIGS. 6, 7, 8, and 11.

The sensor board 10 is a plate-like circuit board extending in the XY plane direction. The sensor board 10 includes a sensor chip mounting surface 10a, a convex portion 10b, both ends thereof in the X direction side protruding in the X direction, a positioning hole 10c, and a connector 10d. The sensor chip mounting surface 10a is a rectangular area extending in the X direction. The plurality of sensor chips 9 are arranged in a line in the X direction in this area. The sensor chip 9 is mounted on the sensor chip mounting surface 10a by gluing, soldering, or the like. At least one line of the sensor chip 9 is arranged, and a plurality of adjacent lines in the Y direction is arranged in parallel in the X direction as necessary. The convex portion 10b is included in the sensor chip mounting surface 10a and positioned at the ends in the X direction. The convex portion 10b is arranged on adjacent surfaces of the sensor boards 10. In addition, an external end of the sensor board 10 positioned at an outermost side may have a non-convex shape. The positioning hole 10c is disposed in a surface other than the sensor chip mounting surface 10a and the convex portion 10b. The positioning hole 10c is to fix the sensor board 10 on the sensor plate 11. Thus, the at least two positioning holes 10c are preferably disposed. The connector 10d is a connector for supplying power, drive-controlling and outputting image information, and is mounted on the back side of the sensor chip mounting surface 10a of the sensor board 10. In addition, an aspect of the sensor board 10 with the sensor chip 9 arranged thereon (mounted thereon) is referred to as a sensor board assembly.

The sensor plate 11 is a rigid plate member formed of a metal such as aluminum, ceramic, or glass that extends in the XY plane direction, and that mounts a plurality of the sensor boards 10. The sensor plate 11 includes a positioning hole 11b and a fixed hole 11a. The positioning hole 11b has a size and a positional relationship corresponding to the positioning hole 10c of the sensor board 10. A plurality of the sensor boards 10 is arranged (mounted) on a line in the X direction. The sensor board 10 is fixed to the sensor plate 11 by gluing, soldering, or the like. At least one line of the sensor board 10 is arranged and a plurality of adjacent lines in the Y direction may be required to be arranged in parallel in the X direction.

An aspect of the sensor plate 11 in a state in which the sensor board 10 is mounted thereon (fixed thereon) is referred to as the light receiving unit. In other words, the light receiving unit according to Embodiment 1 is the sensor plate 11 in a state in which the sensor board 10 is mounted (fixed). In other words, the light receiving unit includes the sensor plate 11 and the sensor board 10 (the sensor board assembly) on which the sensor chip 9 is mounted.

A screw 12 fixes together the sensor board 10, the sensor plate 11, and the housing 7. Naturally, numbers of the positioning hole 10c, the positioning hole 11b, and the screw 12 are to be appropriately changed depending on the size of the image sensor.

The transparent board 13 is a transparent plate formed of glass or transparent resin, extends in the XY plane direction, and is fixed on the open portion of the housing 7. As a reading object such as a manuscript, a bank note, or the like is conveyed on the transparent board 13 in the Y direction, the surface of the transparent board 13 is desirably smooth. In addition, the transparent board 13 is mounted on the side of image scanners such as a copier, a multifunction machine, or the like on which the image sensor according to Embodiment 1 is mounted and there are cases in which the transparent board 13 is not mounted on the side of the image sensor.

The light guide holding member 14 is a plate member extending in the X direction and having a curved surface along the lateral shape of the light guide 1 and a plane along the interior surface of the housing 7. The light guide holding member 14 in combination with the light guide 1 is housed in the housing 7.

Operations of the image sensor according to Embodiment 1 are described below.

The light source 2 changes electrical power applied from outside into light to emit light. The light emitted from the light source 2 enters the inside of the light guide 1 from the longitudinal end of the facing light guide 1, and the light is guided in the inside of the light guide 1 in the longitudinal direction. In other words, the light emitted from the light source 2 repeatedly reflects from the wall surface of the light guide 1 and advances in the longitudinal direction. The light guided inside of the light guide 1 is emitted from the side surface of the light guide 1 as a linear pattern of light from the light guide 1 due to a white print pattern or a convex/concave scattering area formed along the longitudinal direction of the light guide 1. The light emitted from the light guide 1 reflects from the surface of the reading object, and a portion of the reflected light is formed into an image on the sensor chip 9 by the imaging element 8. The sensor chip 9 performs photoelectric conversion of the image-forming light and outputs the electrical signal converted from the light as an image signal to outside via a connector.

Next, a manufacturing method of the image sensor according to Embodiment 1 is described. Because of symmetry in the main scanning direction and in the sub-scanning direction of the image sensor according to Embodiment 1, some processes are described using components of one side.

The basic configuration of the processes of the manufacturing method of the image sensor includes a lighting device assembling process, an imaging element arrangement process, a lighting device mounting process, a sensor (light receiver) arraying process, a sensor board arraying process, and a sensor mounting process. Among these processes, the lighting device assembling process is required to be performed prior to the lighting device mounting process, and the sensor arraying process and the sensor board arraying process are required to be performed prior to the sensor mounting process. In addition, the imaging element arrangement process is required to be performed prior to the lighting device mounting process when the imaging element 8 is difficult to mount after the lighting device mounting process. Hereinafter, each process is described.

The lighting device assembling process and the imaging element arrangement process are described in reference to FIGS. 1 through 3. In the lighting device assembling process, the longitudinal ends of the light guide 1 are inserted into an insertion hole of the holder 6 and fixed to the holder 6. Also, the light guide holding member 14 is attached along the curved surface of the light guide 1. The light source board 3, the heat dissipation sheet 4, and the heat dissipation board 5 are disposed on the other side of the insertion side of the light guide 1, on the other side of the holder 6. The light source board 3 is fixed in such a way that the light source 2 faces the longitudinal end of the light guide 1, and the longitudinal end of the light guide 1 faces and is displaced from the light source 2 at an appropriate distance via the holder 6. The heat dissipation sheet 4 is attached to the back side of the fixed surface of the light source 2 on the light source board 3, and the heat dissipation board 5 is attached to the back side of the attachment surface of the light source board 3 of the heat dissipation sheet 4. Adhesiveness and heat dissipation in the X direction are improved by integrally engaging the light source board 3, the heat dissipation sheet 4, and the heat dissipation board 5 by a retainer disposed in the holder 6. In this way, the light guide 1, the light source board 3, the heat dissipation sheet 4 and the heat dissipation board 5 are assembled by using the holder 6. Thus, a lighting device in which an optical axis is easily and accurately aligned can be obtained by use of the holder 6 alone. The light guide holding member 14 suppresses deflection and warp due to the weight of the light guide 1 which is a long and thin bar member, and appropriately keeps the distance between the light guide 1 and the housing 7. A lighting device 101 includes the light guide 1, the light source 2, the light source board 3, the heat dissipation sheet 4, the heat dissipation board 5, the holder 6 and the light guide holding member 14.

The imaging element arrangement process is a process to fix the imaging element 8 to the slit portion (opening extending in the X direction) of the housing 7. The focal points of the imaging element 8 exist on both sides of the imaging element 8 in the Z direction. Using fixing by an adhesive or a tape, one focal point on one side is positioned at the sensor chip 9 that is assembled later, and the focal point of the other side is positioned at the reading object conveyance plane. Positioning of the imaging element 8 in the X direction and the Y direction is determined by the slit, or is determined by separately providing an adjustment mechanism for the housing 7.

Figure 4:
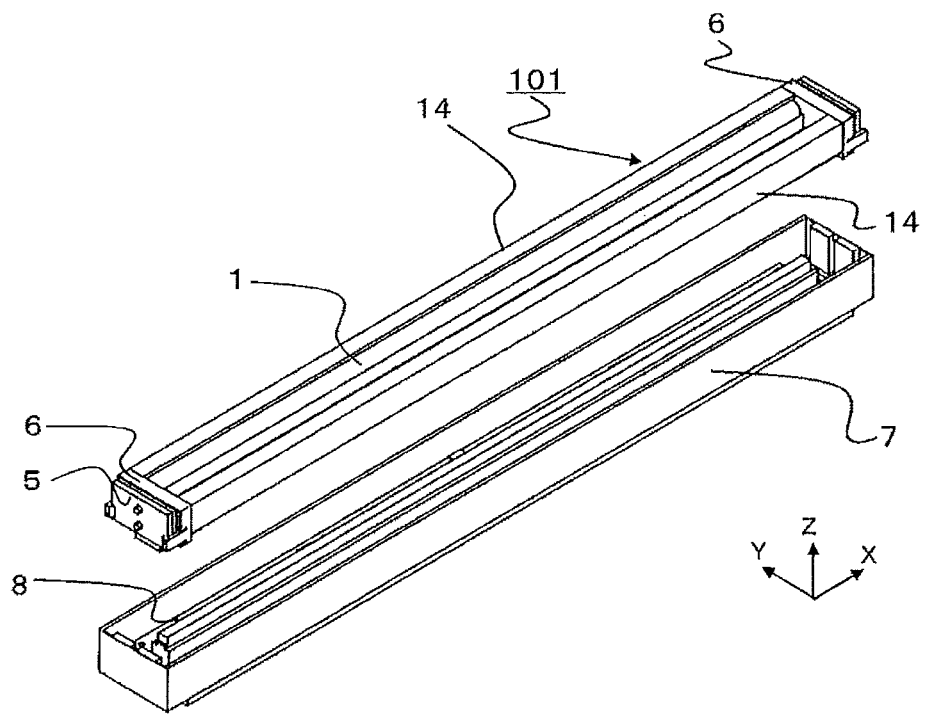
FIG. 4 is a drawing illustrating a lighting device mounting process of the image sensor according to Embodiment 1 of the present disclosure.

The lighting device mounting process is described in reference to FIG. 4. In the lighting device mounting process, the holder 6 and the light guide holding member 14 of the lighting device 101 are mounted and attached to the housing 7 by use of the positioning surface disposed on the X direction end of the housing 7. FIG. 4 illustrates a case in which the lighting device mounting process is performed after the imaging element arrangement process. Strictly speaking, FIG. 4 illustrates a state just before the lighting device 101 is attached to the housing 7.

Figure 6:
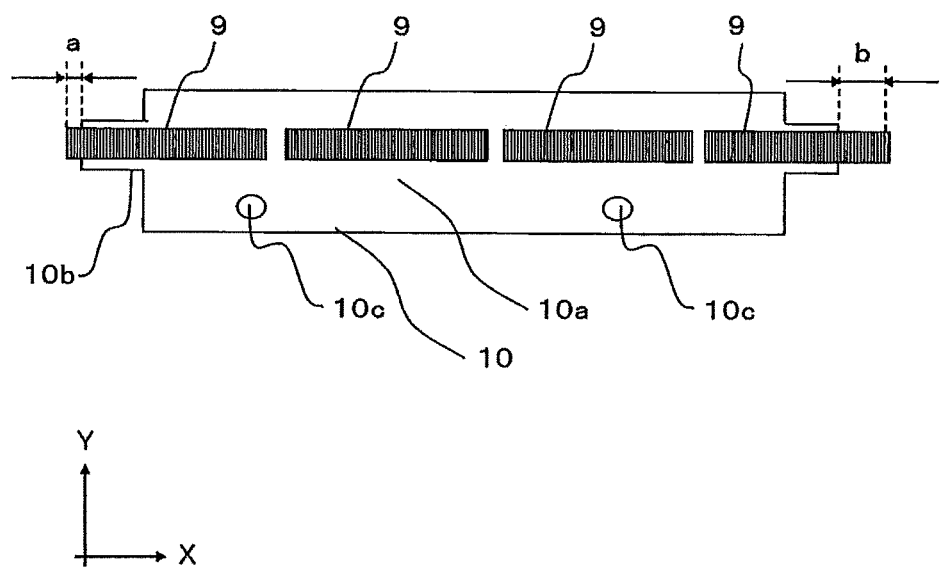
FIG. 6 is an XY plane view of a sensor board according to Embodiment 1 of the present disclosure.

The sensor sequence process is described in reference to FIGS. 5 and 6. The sensor sequence process mounts the sensor chip 9 onto the sensor board 10 in the X direction. As illustrated in FIG. 6, the sensor chips 9 are arranged adjacent one another without contacting the ends thereof in the X direction on the sensor board 10. The endmost portion of the sensor board 10 is mounted with respect to the sensor chip mounting surface 10a in such a way that a portion of the sensor chips 9 including at least an electrical connection pad 9b is arranged on the sensor chip mounting surface 10a, and the endmost portion of the sensor chip 9 not including the electrical connection pad 9b is mounted in a form protruding in the X direction. In other words, in the sensor chip 9 illustrated in FIG. 5, a distance between the endmost portion electrical connection pad 9b in the +X direction and the chip edge of the sensor chip 9 in the +X direction is assumed to be b. Also, in the sensor chip 9 as shown in FIG. 5, a distance between the endmost portion electrical connection pad 9b in the −X direction and the chip edge of the sensor chip 9 in the −X direction is assumed to be "a". When the sensor chip 9 is mounted on the sensor chip mounting surface 10a of the sensor board 10, the endmost portion sensor chip 9 in the +X direction is mounted on the sensor chip mounting surface 10a with the +X direction endmost portion of sensor chip 9 protruding by the length b from the endmost portion of sensor board 10 in the +X direction (the endmost convex portion 10b in the +X direction). Also, when the sensor chip 9 is mounted on the sensor chip mounting surface 10a of the sensor board 10, the endmost portion sensor chip 9 in the −X direction is mounted on the sensor chip mounting surface 10a with the endmost portion sensor chip 9 in the −X direction protruding by the length "a" from the endmost portion of sensor board 10 in the −X direction (the endmost convex portion 10b in the −X direction). In this way, the electrical connection pad 9b of the sensor chip 9 at the X direction end is arranged in the sensor chip mounting surface 10a of the sensor board 10 including the convex portion 10b. The electrical connection pad 9b can be electrically connected to the sensor board 10 using a gold wire or the like.

An aspect of the sensor board 10 with the sensor chip 9 mounted thereon is referred to as the sensor board assembly.

Here, a reason why the sensor chip 9 protrudes from the X direction endmost portion of the sensor board 10 (the endmost convex portion 10b in the X direction) and is mounted onto the sensor board 10 is described. This is because if the sensor chip 9 is mounted at the interior of the sensor board 10, when the below-described sensor boards 10 are arrayed on the sensor plate 11 in the X direction, the interval between the sensor chips 9 mounted on the ends of adjacent sensor boards 10 in the X direction increases, and a pixel gap occurs. When the sensor chip 9 protrudes from the X direction endmost portion of the sensor board 10 (the endmost convex portion 10b in the X direction), and when the sensor board 10 mentioned later is sequenced on the sensor plate 11 in the X direction, the sensor chips 9 are arranged close to one another in a range in which the sensor chips 9 does not contact. Thus, an effect is generated that no pixel gap occurs or a number of lacked pixels can be reduced even if the pixel gap occurs.

A protrusion length of the sensor chip 9 from the X direction endmost portion of the sensor board 10 (the endmost convex portion 10b in the X direction) is a length from an electrical connection pad 9b closest to the X direction end of the sensor chip 9 to the X direction end of the sensor chip 9, the length being lengths of some of the pixels 9a. In addition, major portion of the sensor chip 9 is fixed to the sensor board 10. Thus, an image sensor in this manner can be obtained that is resistant to external force, and even if the external force is applied to the image sensor, the sensor chip 9 is undamaged.

Figure 7:
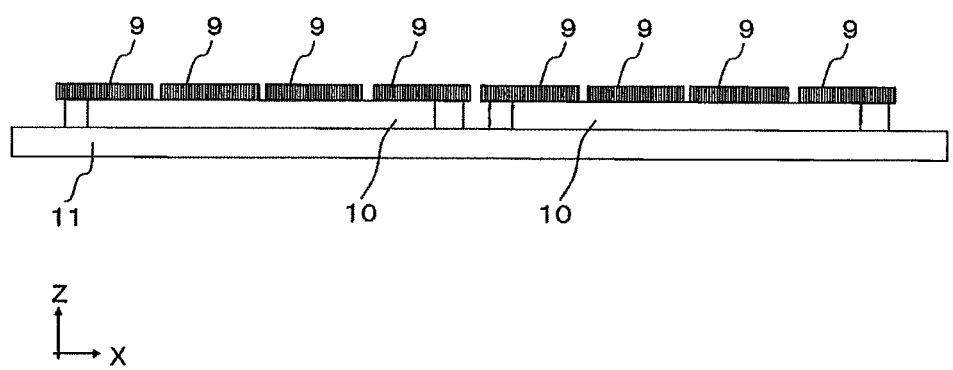
FIG. 7 is an XZ plane view of sensor boards (light receiving unit) disposed in a line on a sensor plate according to Embodiment 1 of the present disclosure.
Figure 8:
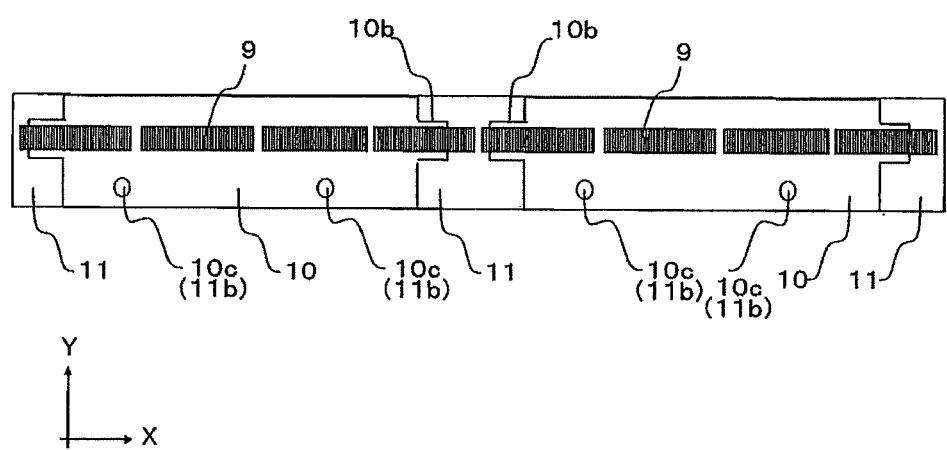
FIG. 8 is an XY plane view of the sensor boards (light receiving unit) disposed in a line on a sensor plate according to Embodiment 1 of the present disclosure.

In reference to FIGS. 7 and 8, the sensor board arraying process is described in which the sensor boards 10 on which the sensor chip 9 are mounted are arrayed on the sensor plate 11. A plurality of the sensor boards 10 are arrayed in a line in the X direction. The sensor boards 10 are positioned in such a way that portions of the sensor chips 9 are mounted at the X direction ends of adjacent sensor boards 10, the portions protruded from the convex portion 10*b* of the sensor boards 10 are next to one another without contacting to one another, and the sensor boards 10 are arrayed and mounted (fixed) on the sensor plate 11. The positioning of the sensor board 10 on the sensor plate 11 is performed using the convex portion 10*b*. In addition, the rows of the pixels 9*a* of the sensor chips 9 mounted on the adjacent sensor boards 10 are positioned to be arrayed in the same line.

Figure 9A:
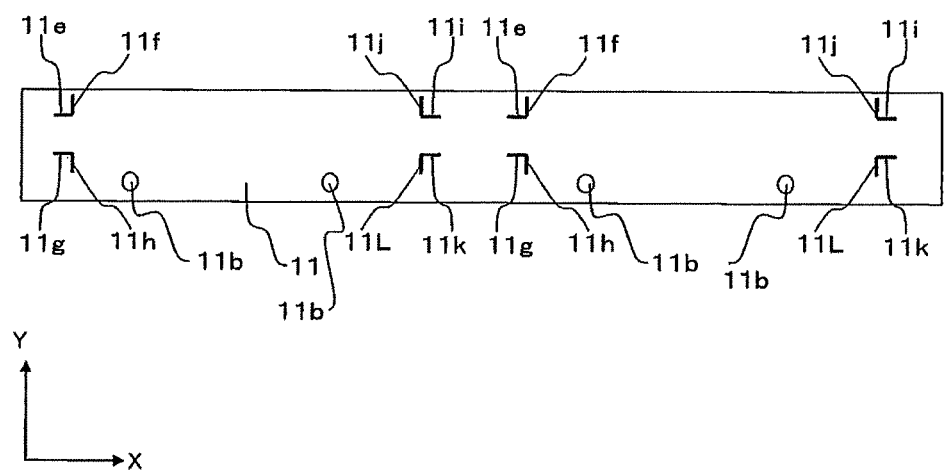
FIG. 9A is a drawing illustrating a sensor board arraying process of the sensor boards disposed in a line on a sensor plate according to Embodiment 1 of the present disclosure.
Figure 9B:
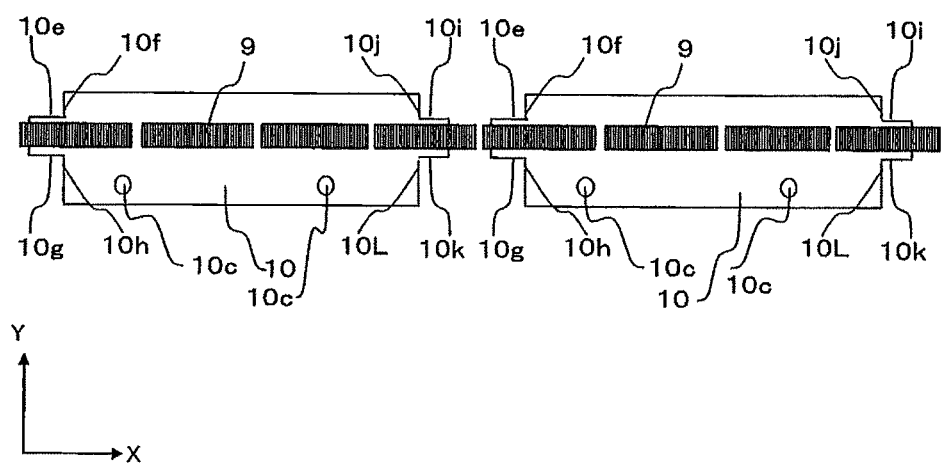
FIG. 9B is a drawing illustrating the sensor board arraying process of the sensor boards disposed in a line on a sensor plate according to Embodiment 1 of the present disclosure.
Figure 9C:
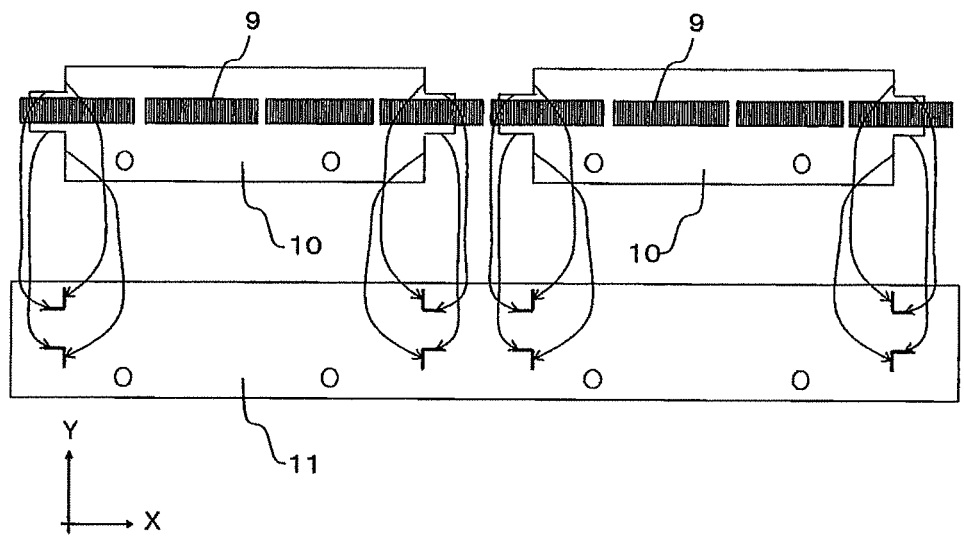
FIG. 9C is a drawing illustrating the sensor board arraying process of the sensor boards disposed in a line on a sensor plate according to Embodiment 1 of the present disclosure.

The sensor board arraying process in which the sensor board 10 is arrayed on the sensor plate 11 is described in detail in reference to FIGS. 9A, 9B, and 9C. For example, as illustrated in FIG. 9A, marks for positioning the sensor board 10 are marked on the sensor plate 11 in the X direction (X direction marks: 11*e*, 11*g*, 11*i*, and 11*k*) and the Y direction (for Y direction marks: 11*f*, 11*h* 11*j*, and 11L). As illustrated in FIG. 9C; sides of the convex portion 10*b* of the sensor board 10 extending in the X direction, 10*e*, 10*g*, 10*i*, and 10*k* (refer to FIG. 9B) are matched with the X direction marks, 11*e*, 11*g*, 11*i*, and 11*k* on the sensor plate 11, respectively. Furthermore, sides of the convex portion 10*b* of non-convex portion of the convex portion 10*b* of the sensor board 10 extending in the Y direction, 10*f*, 10*h*, 10*j*, and 10L (refer to FIG. 9B) are overlapped with the Y direction marks, 11*f*, 11*h*, 11*j*, and 11L, respectively. As a result, the sensor board 10 can be accurately mounted on the sensor plate 11. In this way, the sensor chips 9 mounted at the ends of the sensor board 10 in the X direction are also accurately arrayed next to one another.

Figure 10A:
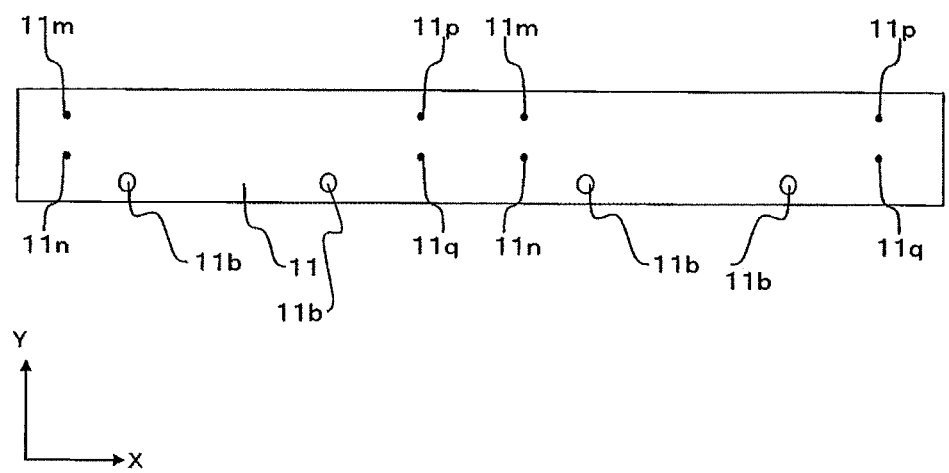
FIG. 10A is a drawing illustrating the sensor board arraying process of the sensor boards disposed in a line on a sensor plate according to Embodiment 1 of the present disclosure.
Figure 10B:
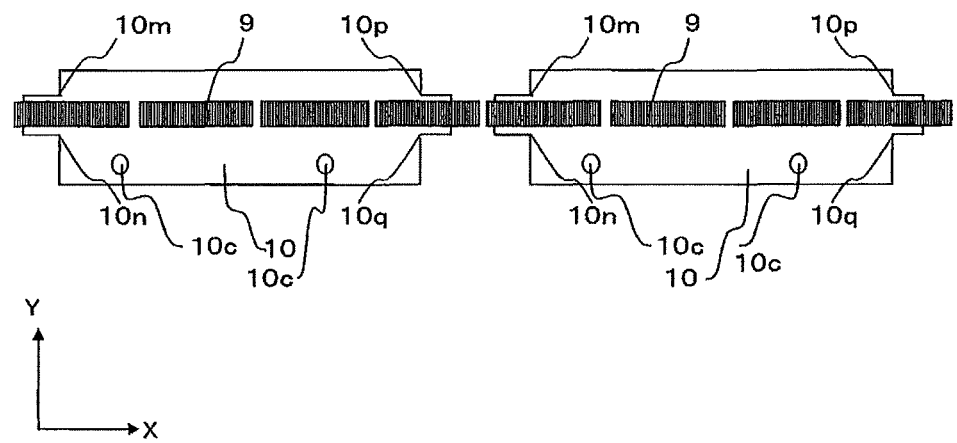
FIG. 10B is a drawing illustrating the sensor board arraying process of the sensor boards disposed in a line on a sensor plate according to Embodiment 1 of the present disclosure.
Figure 10C:
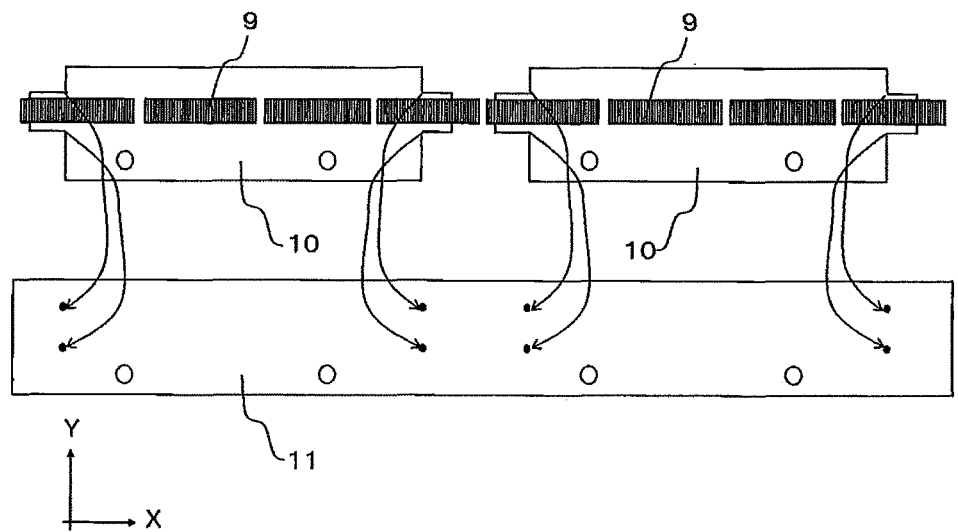
FIG. 10C is a drawing illustrating the sensor board arraying process of the sensor boards disposed in a line on a sensor plate according to Embodiment 1 of the present disclosure.
Figure 11:
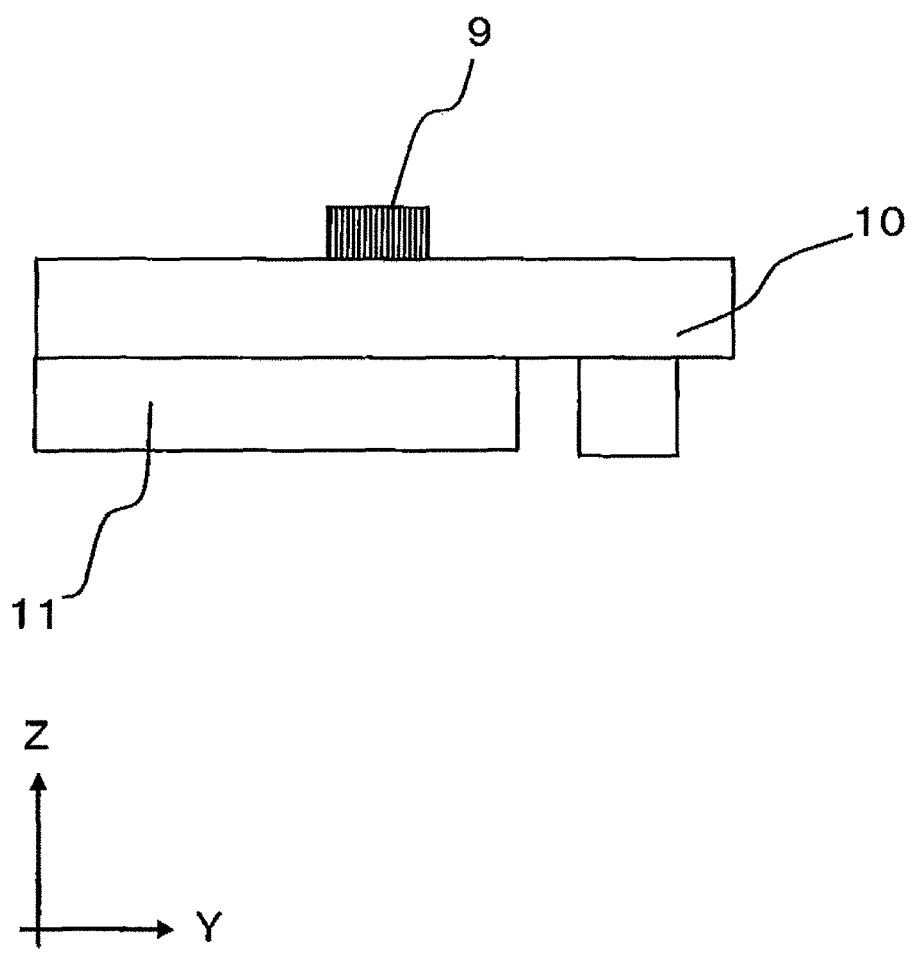
FIG. 11 is a YZ end view of the sensor boards (light receiving unit) disposed in a line on a sensor plate according to Embodiment 1 of the present disclosure.

In reference to FIGS. 10A, 10B, and 10C, another example of the sensor board mounting process in which the sensor board 10 is arrayed on the sensor plate 11 is described in detail. As illustrated in FIG. 10A, for positioning sensor board 10 of another example, point marks or positioning pins 11*m*, 11*n*, 11*p*, and 11*q* are positioned at the positions corresponding to intersection points of the X direction sides and the Y direction sides of the sensor board 10 of the proximal portion of the convex portion 10*b* on the sensor plate 11. As illustrated in FIG. 10C, the sensor board 10 is arrayed by overlapping the point marks or positioning pins 11*m*, 11*n*, 11*p*, and 11*q* with the intersection points 10*m*, 10*n*, 10*p*, and 10*q* (refer to FIG. 10B) of the X direction sides and the Y direction sides of the sensor board 10 of the root portion of the convex portion 10*b*. As the result, the sensor board 10 can be accurately arrayed on the sensor plate 11. In addition, the distance between the adjacent sensor boards 10, that is, the distance between the adjacent sensor chips 9 is appropriately maintained by matching and positioning the positioning hole 11*b* with the positioning hole 10*c*. In addition, after arraying the sensor board 10 on the sensor plate 11, the positioning pins may be retained or may be removed.

When the sensor boards 10 are mounted on the sensor plate 11, the sensor boards 10 is mounted on the sensor plate 11 in such a way that the gap between the facing sensor chips 9 that are mounted at the ends of the adjacent sensor boards 10 in the X direction is in the following state. Firstly, positioning is as follows in a case in which the length between the center of the pixel 9*a* formed at the X direction end of the sensor chip 9 and the X direction end of the sensor chip 9 is smaller than a half of the length of the X direction interval (referred to as a pixel pitch) between the centers of the pixels 9*a* formed on the sensor chip 9: the sensor boards 10 are mounted on the sensor plate 11 in such a way that the interval between the pixels 9*a* at the ends of the facing sensor chips 9 equals to the pixel pitch. Secondly, positioning is as follows in a case in which the length between the center of the pixel 9*a* formed at the X direction end of the sensor chip 9 and the X direction end of the sensor chip 9 is greater than a half of the length of the X direction interval between the centers of the pixels 9*a* formed on the sensor chip 9 (referred to as the pixel pitch): the sensor boards 10 are arrayed on the sensor plate 11 in such a way that the interval between the pixels 9*a* at the ends of the facing sensor chips 9 is a pixel pitch that equals to the smallest integer of 2 or more times the interval between the pixels 9*a* at the ends of the facing sensor chips 9 within a range in which the facing sensor chips 9 do not contact to one another. In other words, the facing sensor chips 9 are spaced in such a way that the interval between the pixels 9*a* at the ends of the facing sensor chips 9 is N (N is an integer) times the pixel pitch. Within a range in which the facing pixels 9*a* do not contact one another, N is set to 1 or a smallest possible number to reduce pixel gaps and to avoid degrading image quality of the space between the facing sensor chips 9. As an example, when the resolution is 600 dpi, the pixel pitch of the pixel 9*a* of the sensor chip 9 is 42.3 µm. Thus, the minimum interval between the pixels 9*a* at the ends of the facing sensor chips 9 is 42.3 µm.

The aspect of the sensor plate 11 with the sensor board 10 mounted thereon (fixed thereon) is referred to as the light receiving unit. Thus, a light receiving unit assembling process includes the sensor arraying process and the sensor board arraying process.

As illustrated in FIG. 2, in the sensor mounting process, the sensor plate 11 is fixed to the housing 7 using the screw 12 in such a manner that the sensor chip 9 is mounted inside the housing 7 at the back side in the Z direction on the side of the housing 7 on which the lighting device is mounted and the sensor chips 9 are aligned on the optical axis of the imaging element 8 in the X direction.

Figure 12:
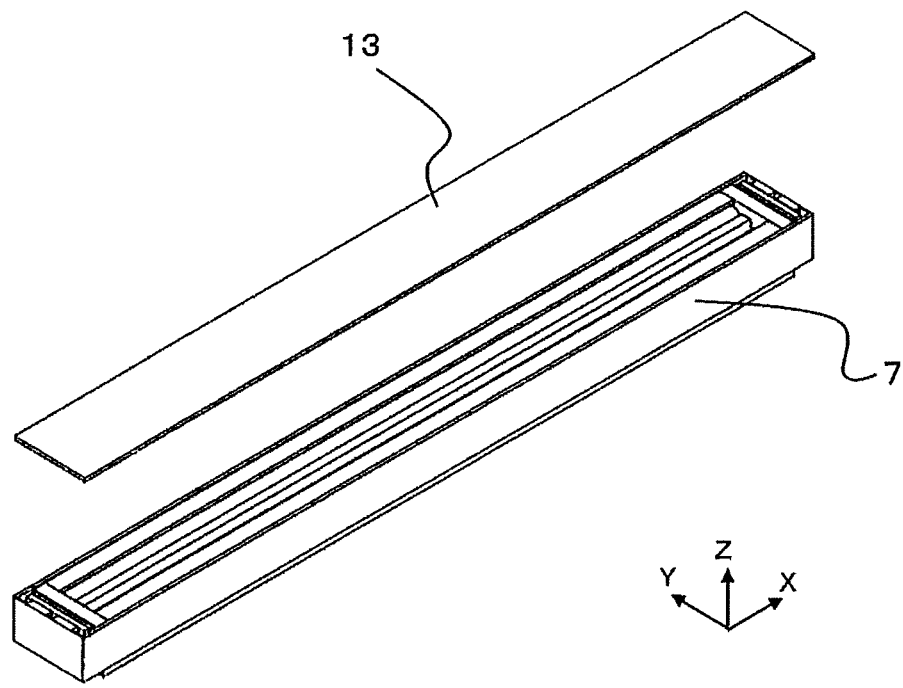
FIG. 12 illustrates a transparent plate mounting process mounting a transparent board onto the image sensor according to Embodiment 1 of the present disclosure.

FIG. 12 illustrates a transparent plate mounting process that is required to be performed after at least the lighting device assembling process, the imaging element arrangement process, and the lighting device mounting process when the transparent board 13 is disposed in the image sensor according to Embodiment 1. In the transparent plate mounting process, the transparent board 13 is mounted on the housing 7. The mounting surface of the transparent board 13 preferably matches the external shape of the transparent board 13. The transparent board 13 is fixed with an adhesive or the like by using an uppermost portion of the housing 7 or by forming stair-like steps having a shape that can hold the transparent board 13 at an edge of one opening of the housing 7, In this way, in the image sensor according to Embodiment 1, the sensor chip 9 protrudes in the longitudinal direction from the convex portion 10*b* at the longitudinal direction end of the sensor board 10 by the length between the longitudinal direction end of the sensor chip 9 and the electrical connection pad 9*b* closest to the longitudinal direction end of the sensor chip 9. Next, while the positioning of the sensor board 10 is performed using the convex portion 10*b*, the sensor chips 9 protruding from the sensor boards 10 adjacently positioned, and the sensor boards 10 are positioned a line in the longitudinal direction. Therefore, the light receiving unit of the image sensor is effective in obtaining a structure that is easy to assemble and resistant to external force.

As illustrated in FIGS. 2 and 3, in Embodiment 1, the aspect is described in which a lighting device including the light source 2 and the light guide 1 and the light receiving unit are housed in the same housing 7, and the light receiving unit receives reflected light, the light being from the lighting device and reflected by the reading object. Alternatively, another configuration may be formed in which a lighting device including the light source 2 and the light guide 1 is taken out from the housing 7 and disposed opposite to the light receiving unit with the transparent board 13 interposed therebetween, and the reading object is conveyed between the transparent board 13 and the lighting device. In this case the light receiving unit receives transmitted light, the light from the lighting device transmitted through the reading object. Operational effects thereof are the same as the aspect of FIGS. 2 and 3 that receives reflected light.

Embodiment 2

Figure 13:
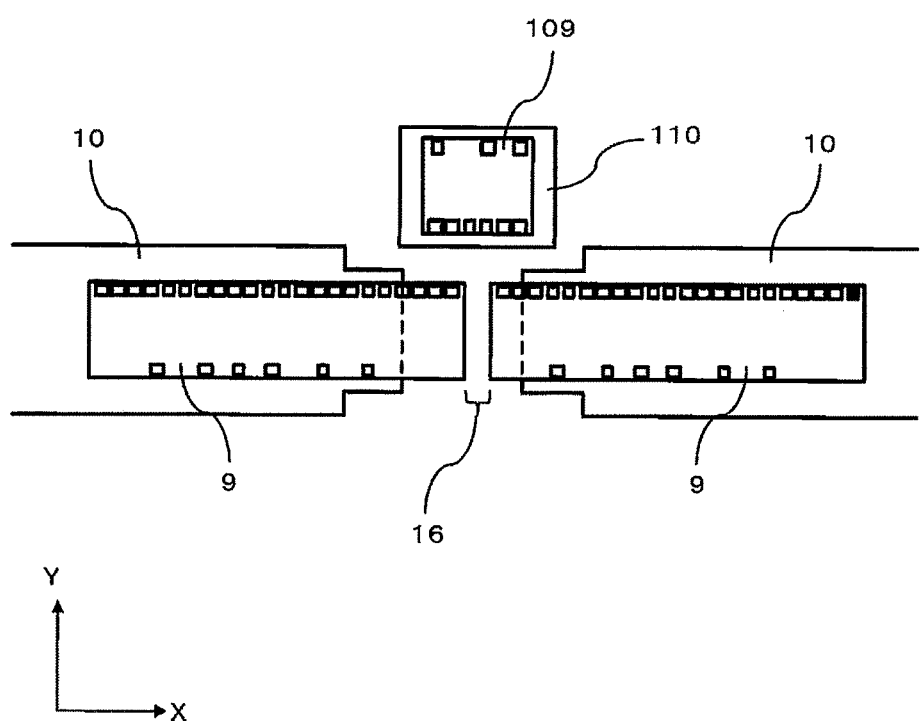
FIG. 13 is an XY plane view of sensor boards (light receiving unit) disposed in a line according to Embodiment 2 of the present disclosure.
Figure 14:
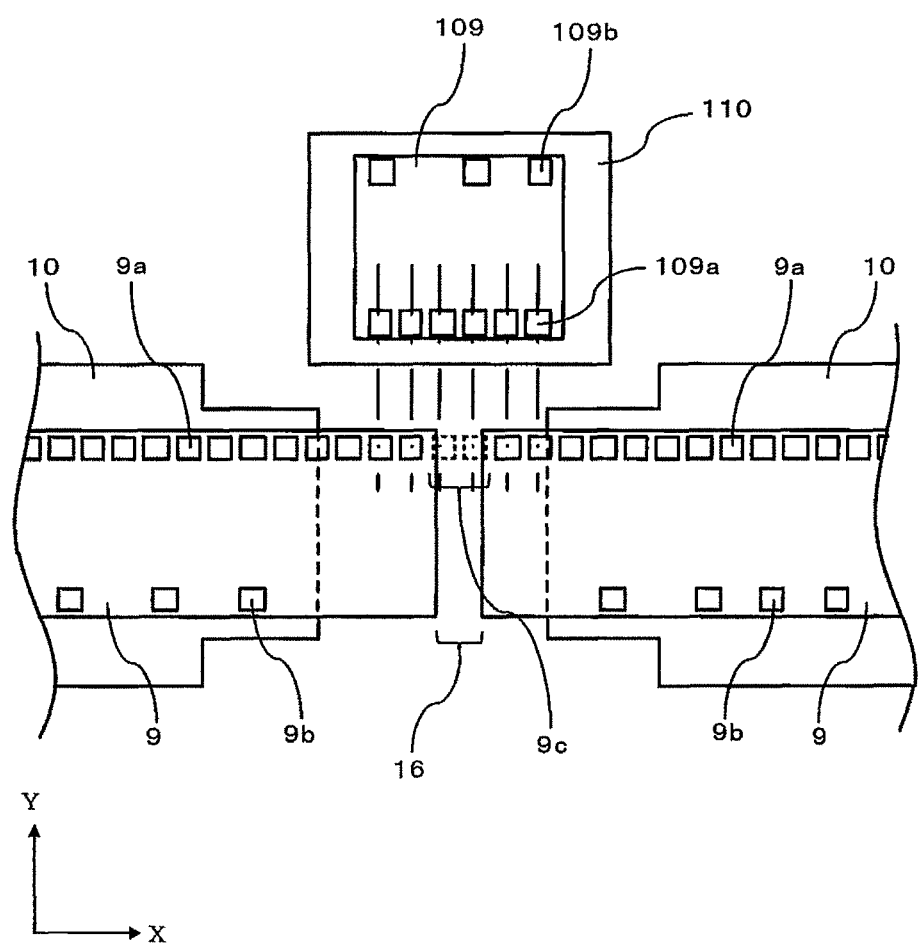
FIG. 14 is an XY plane view describing pixel interpolation of the sensor boards (light receiving unit) disposed in a line according to Embodiment 2 of the present disclosure.

In reference to FIGS. 13 and 14, a light receiving unit according to Embodiment 2 of the present disclosure is described. In FIGS. 13 and 14, components that are the same or equivalent components of FIGS. 1 through 12 are denoted by the same reference signs, and the explanations thereof are omitted. In the drawings of Embodiment 2, the definitions of the 3 axes denoted by X, Y, and Z, that are perpendicular to one another, are the same as in Embodiment 1.

In the light receiving unit of Embodiment 1, the sensor board 10 is arrayed on the sensor plate 11 within the range in which the interval between the pixels 9*a* at the ends of the facing sensor chips 9 is such that the facing sensor chips 9 do not contact one another. Therefore, a gap 16 is generated between the facing sensor chips 9. As no pixel 9*a* exists in the gap 16, a lacked pixel (pixel gap) 9*c* occurs. Each sensor chip 9 is mounted such that the rows of the pixels 9*a* of each facing sensor chip 9 are arranged on the same line.

In the light receiving unit according to Embodiment 2, an interpolation sensor chip 109 is arranged in which a second pixel 109*a* is formed, in addition to the light receiving unit according to Embodiment 1. The interpolation sensor chip 109 is mounted and glued to an interpolation sensor board 110 with by gluing, soldering, or the like. The interpolation sensor board 110 is mounted (fixed) to the sensor plate 11 by gluing, soldering, or the like. The interpolation sensor chip 109 includes an electrical connection pad 109*b* outputting to outside an electrical signal that is converted from the light received by the second pixel 109*a*. The sensor board 10 and the interpolation sensor board 110 are mounted (fixed) to the sensor plate 11 by gluing, soldering, or the like. The sensor plate 11 is omitted in FIGS. 13 and 14.

The interpolation sensor chip 109 is arranged next to the ends of the facing sensor chips 9 in the lateral direction of the sensor chip 9 ("the lateral direction of the sensor chip 9" corresponds to the sub-scanning direction of the image sensor). The interpolation sensor chip 109 is arranged to be adjacent to both ends of the facing sensor chips 9. In the interpolation sensor chip 109, a plurality of the second pixels 109*a* is formed in a line in the same direction as the longitudinal direction of the sensor chip 9, in other words, the main scanning direction. In the interpolation sensor chip 109, at least one line of the second pixels 109*a* is arranged to be shifted in the sub-scanning direction. The plurality of the second pixels 109*a* overlaps the pixels 9*a* of the each sensor chip 9 in the main scanning direction. In FIG. 14, 6 elements of the second pixel 109*a* are formed. The pixel pitch of the second pixel 109*a* is the same as the pixel pitch of the pixel 9*a* of the sensor chip 9.

When viewed through the sensor chip 9 in the lateral direction thereof in FIG. 14, among the 6 elements of the second pixel 109*a*, 2 elements at one end in the line direction (the same direction as the longitudinal direction of the sensor chip 9) overlap 2 elements of the pixel 9*a* formed at the end of one of the sensor chips 9 in the facing sensor chips 9 (refer to dashed lines of FIG. 14). In addition, when seen through in the lateral direction of the sensor chip 9 in FIG. 14, among the 6 elements of the second pixel 109*a*, 2 elements at the other end in the line direction (the same direction as the longitudinal direction of the sensor chip 9) overlap 2 elements of the pixel 9*a* formed at the end of the other sensor chip 9 in the facing sensor chips 9 (refer to dashed lines of FIG. 14). In FIG. 14, there are 2 overlapping second pixels 109*a*. A minimum of one element may overlap.

Therefore, among the 6 elements of the second pixel 109*a*, except for 4 elements at the ends in the line direction (the same direction as the longitudinal direction of the sensor chip 9), 2 elements of the second pixel 109*a* in the central portion in the line direction (the same direction as the longitudinal direction of the sensor chip 9) are interpolation pixels that interpolate the lacked pixel 9*c*.

Thermal expansion or contraction, depending on a use temperature, is produced in the light receiving unit including the sensor chip 9 per thermal expansion coefficients. Therefore the interval of the gap 16 between the ends of the facing sensor chips 9 changes depending on the use temperature. Therefore, in the interpolation sensor chip 109, a sufficient number of the second pixels 109*a* are formed that can interpolate the lacked pixel 9*c* even when the interval of the gap 16 between the ends of the facing sensor chips 9 is the greatest within the use temperature range.

In other words, in the interpolation sensor chip 109, the second pixels 109*a* are formed such that the distance from the second pixel 109*a* at one end of the row of the second pixel 109*a* formed in a line to the second pixel 109*a* at the other end is equal to or greater than the interval between the pixels 9*a* formed at the ends of the facing sensor chips 9 when the interval is the greatest within an operation temperature range of the sensor chip 9.

An example is indicated and described. An example is shown in which the sensor plate 11 is formed of aluminum, the sensor board 10 is formed of a glass epoxy base, and the sensor chip 9 is formed of a silicon semiconductor substrate. The interval of the gap 16 between the ends of the facing sensor chips 9 is assumed to be 50 µm at a temperature of +25 degrees. When this state is simulated, result of the simulation indicates that the interval of the gap 16 is 107 µm at a temperature of +80 degrees, and the interval of the gap 16 is 3 µm at temperature of −20 degrees.

When the resolution is 600 dpi, the pixel pitch of the pixel 9*a* of the sensor chip 9 is 42.3 µm. Thus, the number of the lacked pixels 9*c* is two at the temperature of 25 degrees. Thus, 4 is sufficient as the number of the second pixels 109*a* of the interpolation sensor chip 109.

By the way, the interval of the gap 16 at the ends of the facing sensor chips 9 is 107 µm at the temperature of +80 degrees. Thus, the number of the lacked pixels 9*c* is three pixels. Thus, at least five pixels of the second pixel 109*a* of the interpolation sensor chip 109 are required.

Thus, in the above-mentioned example of Embodiment 2, at least five pixels of the second pixel 109*a* are formed on the interpolation sensor chip 109. The at least five pixels of the second pixel 109*a* can interpolate the lacked pixel 9*c* even when the interval of the gap 16 between the ends of the facing sensor chips 9 is increased to the largest value 107 µm within the use temperature range (−20 degrees through +80 degree). In this way, in Embodiment 2, a size change of the light receiving unit in the use temperature range is absorbed and the lacked pixel can be interpolated.

Embodiment 3

Figure 15:
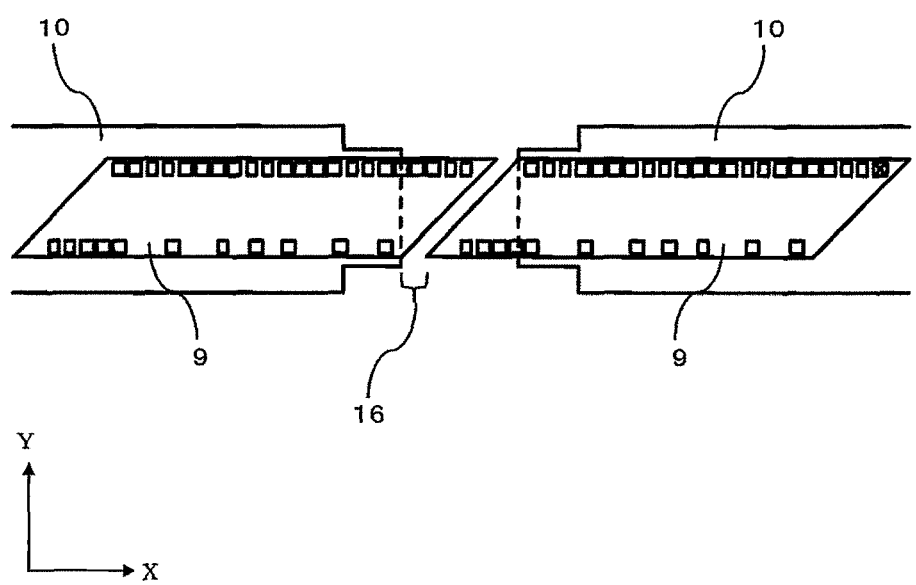
FIG. 15 is an XY plane view of sensor boards (light receiving unit) disposed in a line according to Embodiment 3 of the present disclosure.
Figure 16:
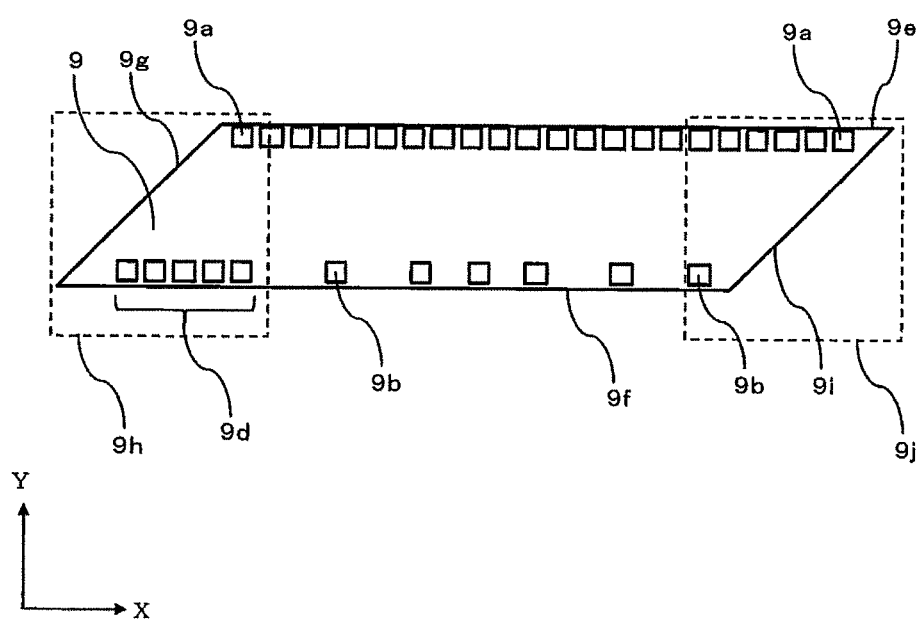
FIG. 16 is a drawing illustrating a sensor chip according to Embodiment 3 of the present disclosure.
Figure 17:
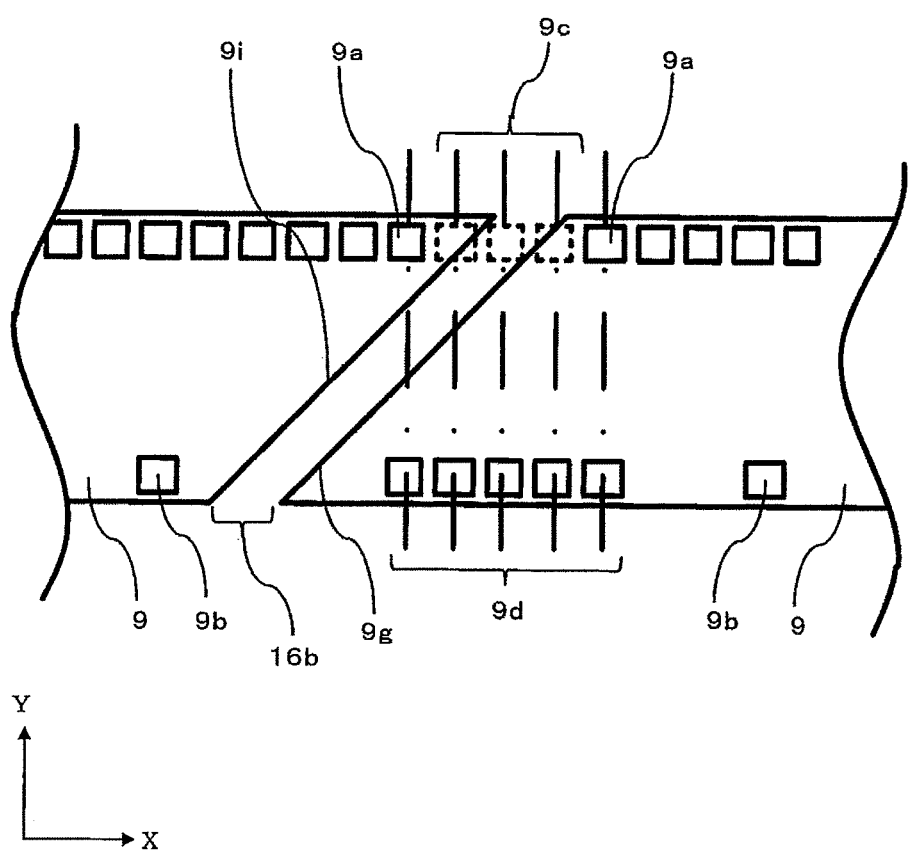
FIG. 17 is an XY plane view explaining pixel interpolation of the sensor boards (light receiving unit) disposed in a line according to Embodiment 3 of the present disclosure.

In reference to FIGS. 15 through 17, a light receiving unit according to Embodiment 3 of the present disclosure is described. In FIGS. 15 through 17, components that are the same or equivalent components of FIGS. 1 through 12 are denoted by the same reference symbols and the explanations thereof are omitted. In the drawings of Embodiment 3, the definitions of the 3 axes denoted by X, Y, and Z, that are perpendicular to one another, are the same as in Embodiment 1.

In the light receiving unit of Embodiment 1, the sensor boards 10 are arrayed on the sensor plate 11 such that the interval between the pixels 9a at the ends of the facing sensor chips 9 is formed within the range in which the facing sensor chips 9 do not contact one another. Therefore, the gap 16 is generated between the facing sensor chips 9. As no pixel 9a exists in the gap 16, the lacked pixel (pixel gap) 9c occurs. The each sensor chip 9 is mounted such that the rows of the pixels 9a of the each facing sensor chip 9 are arrayed on the same line.

In the light receiving unit according to Embodiment 3, the sensor chip 9 has a shape of a parallelogram. The sensor chip 9 is arranged in such a way that inclined sides formed at longitudinal ends of the parallelogram face each other. The sensor chip 9 is mounted to the sensor board 10 by gluing, soldering, or the like. The sensor board 10 is (mounted) fixed to the sensor plate 11 by gluing, soldering, or the like. The sensor plate 11 is omitted in FIG. 15.

Specifically, one longitudinal end of the sensor chip 9 includes a first inclined side 9g having an inclined shape from one side 9e in the longitudinal direction of the sensor chip 9 to other side 9f in the longitudinal direction outwardly in the longitudinal direction of the sensor chip 9 and a first inclined portion 9h formed of the other side 9f of the longitudinal direction. The other longitudinal end of the sensor chip 9 includes a second inclined side 9i having an inclined shape from the other side 9f in the longitudinal direction of the sensor chip 9 to the one side 9e outwardly in the longitudinal direction of the sensor chip 9 and a second inclined portion 9j formed of the one side 9e of the longitudinal direction.

The ends of the facing sensor chips 9 are arranged to be overlapped, when the first inclined side 9g of one of the sensor chips 9 and the second inclined side 9i of the other sensor chip 9 are seen through in the longitudinal direction of the sensor chip 9 and in the lateral direction perpendicular to the longitudinal direction. In the sensor chip 9, a plurality of the pixel 9a is formed in a line in the longitudinal direction on the one side 9e. The each sensor chip 9 is mounted such that the rows of the pixels 9a of each facing sensor chip 9 are arranged on the same line.

In the sensor chip 9, a plurality of the second pixel 9d is formed in a line in the longitudinal direction on the other side 9f of the first inclined portion 9h. The plurality of linear second pixels 9d is formed with a shift of at least one line in the sub-scanning direction from the plurality of linear pixels 9a. The pixel pitch of the second pixel 9d is the same as the pixel pitch of the pixel 9a. When seen through in the lateral direction of the sensor chip 9, the second pixel 9d is formed at a position overlapping the pixel 9a, the second pixel 9d being positioned at the end opposite to the first inclined side 9g, namely on the second inclined side 9i, in the second pixel line formed of the plurality of linearly formed second pixels 9d. The facing sensor chips 9 are implemented in such a way that, when seen through in the lateral direction of the sensor chip 9, the second pixel 9d overlaps the pixel 9a on the side of the second inclined side 9i of the facing and opposing sensor chips 9, the second pixel 9d being positioned at the end on the side of the first inclined side 9g, in the second interpolation pixel row formed of the plurality of linearly formed second pixels 9d.

In FIG. 17, 5 elements of the second pixel 9d are formed. When seen through in the lateral direction of the sensor chip 9 in FIG. 17, among the 5 elements of the second pixel 9d, one element positioned at the end on the opposite side of the first inclined side 9g side in the line direction (the same direction as the longitudinal direction of the sensor chip 9), namely, on the side of the second inclined side 9i, overlaps one element of the pixel 9a formed on the sensor chip 9 on which the second pixel 9d is formed. In addition, when seen through in the lateral direction of the sensor chip 9 in FIG. 17, among the 5 elements of the second pixel 9d, one element positioned at the end on the side of the first inclined side 9g in the line direction (the same direction as the longitudinal direction of the sensor chip 9) overlaps one element of the pixel 9a formed at the end on the side of the second inclined side 9i of the opposing and facing sensor chip 9. Although one element of the second pixel 9d overlaps in FIG. 17, two or more elements may overlap.

Therefore, among the 5 elements of the second pixels 9d, except for two elements at the both ends of the line direction (the same direction as the longitudinal direction of the sensor chip 9), three elements of the second pixel 9d in the central portion in the line direction (the same direction as the longitudinal direction of the sensor chip 9) are interpolation pixels that interpolate the lacked pixels 9c.

Thermal expansion or contraction, depending on a use temperature, is produced in the light receiving unit including the sensor chip 9 per a thermal expansion coefficient. Therefore the interval of the gap 16 between the ends of the facing sensor chips 9 changes depending on the use temperature. Therefore, in the sensor chip 9, a sufficient number of the second pixels 9d are formed that can interpolate the lacked pixel 9c even when the interval of the gap 16 between the ends of the facing sensor chips 9 is the greatest within the use temperature range.

In other words, in the sensor chip 9, the second pixels 9d are formed such that a distance from the second pixel 9d at one end of the row of the second pixel 9d formed in a line to the second pixel 9d at the other end is equal to or greater than an interval between the pixels 9a formed at the ends of the facing sensor chips 9 when the interval is the greatest within an operation temperature range of the sensor chip.

An example is indicated and described. An example is shown in which the sensor plate 11 is formed of aluminum, the sensor board 10 is formed of a glass epoxy base, and the sensor chip 9 is formed of a silicon semiconductor substrate. The interval of the gap 16 between the ends of the facing sensor chips 9 is assumed to be 50 μm at a temperature of +25 degrees. When this state is simulated, the interval of the gap 16 is 107 μm at a temperature of +80 degrees, and, at a temperature of −20 degrees, the interval of the gap 16 is 3 μm as the result.

When the resolution is 600 dpi, the pixel pitch of the pixel 9a of the sensor chip 9 is 42.3 μm. Thus, a number of the lacked pixels 9c is three at the temperature of 25 degrees as the sensor chip 9 has a shape of a parallelogram. Thus, 5 pixels of the second pixels 9d of the sensor chip 9 are sufficient.

By the way, the interval of the gap 16 at the ends of the facing sensor chips 9 is 107 μm at the temperature of +80 degrees. Thus, the number of the lacked pixels 9c is four pixels. Thus, at least six pixels of the second pixel 9d of the sensor chip 9 are required.

Thus, in the above-mentioned example of Embodiment 3, at least six pixels of the second pixel 9d are formed on the sensor chip 9. The at least six pixels of the second pixel 9d can interpolate the lacked pixel 9c, even when the interval of the gap 16 between the ends of the facing sensor chips 9 is increased to the largest value 107 μm within the use temperature range (−20 degrees through +80 degree). In this way, in Embodiment 3, a size change of the light receiving unit in the use temperature range is absorbed and the lacked pixel can be interpolated.

REFERENCE SIGNS LIST

1 Light guide
2 Light source
3 Light source board
4 Heat dissipation sheet
5 Heat dissipation board
6 Holder
7 Housing
8 Imaging element
9 Sensor chip
9a Pixel
9b Electrical connection pad
9c Lacked pixel
9d Second pixel
9e One side
9f Other side
9g First inclined side
9h First inclined portion
9i Second inclined side
9j Second inclined portion
10 Sensor board (sensor board assembly)
10a Sensor chip mounting surface
10b Convex portion
10c Positioning hole
10d Connector
10e Side
10f Side
10g Side
10h Side
10i Side
10j Side
10k Side
10L Side
10m Intersection point
10n Intersection point
10p Intersection point
11q Intersection point
11 Sensor plate
11a Fixed hole
11b Positioning hole
11e Mark
11f Mark
11g Mark
11h Mark
11i Mark
11j Mark
11k Mark
11L Mark
11m Point mark or positioning pin
11n Point mark or positioning pin
11p Point mark or positioning pin
11q Point mark or positioning pin
12 Screw
13 Transparent board
14 Light guide holding member
16 Gap
101 Lighting device
109 Interpolation sensor chip
109a Second pixel
109b Electrical connection pad
110 Interpolation sensor board

The invention claimed is:

1. A light receiving unit comprising:
a sensor board assembly on which a plurality of sensor chips are arrayed in a line in a longitudinal direction of a sensor board and are mounted on the sensor board; and
a sensor plate on which a plurality of the sensor board assemblies are arrayed and mounted in a line in the longitudinal direction;
wherein each sensor chip of the plurality of sensor chips includes a plurality of pixels formed in a line in the longitudinal direction;
at longitudinal ends of the sensor board assembly, sensor chips of the plurality of sensor chips protrude outward of the sensor board in the longitudinal direction from the longitudinal ends of the sensor board;
facing sensor chips of the plurality of sensor chips mounted at the longitudinal ends of the adjacent sensor board assemblies are positioned so that ends of the facing sensor chips are spaced at a predetermined interval;
the sensor board includes convex portions protruding in the longitudinal direction at the longitudinal ends; and
the sensor chips that protrude outward of the sensor board are mounted on the convex portions,
wherein the sensor board assembly is mounted on the sensor plate by aligning a position of the convex portion of the sensor board with a position adjustment portion disposed on the sensor plate.

2. The light receiving unit according to claim 1,
wherein each of the plurality of sensor chips further comprises a plurality of electrical connection pads formed in the longitudinal direction at a position different from positions of the plurality of pixels in the lateral direction; and
a protrusion length of the sensor chips protruding from the longitudinal ends of the sensor board assembly to the outside of the sensor board assembly towards the longitudinal direction is less than or equal to a distance between the longitudinal end of the sensor chip and the electrical connection pad closest to the longitudinal end of the sensor chips.

3. The light receiving unit according to claim 1, further comprising an interpolation sensor chip arranged, adjacent in the lateral direction perpendicular to the longitudinal direction, to the facing ends of the facing sensor chips
wherein the interpolation sensor chip includes a plurality of second pixels formed in a line in the longitudinal direction; and
when the facing sensor chips and the interpolation sensor chip are seen through in the lateral direction, (i) a second pixel at one end of a row of the second pixel formed in a line and the pixel formed at one end of one of the plurality of sensor chips overlap, and (ii) the second pixel at another end of the row of the second pixel and the pixel formed at one end of another of the plurality of sensor chips overlap.

4. The light receiving unit according to claim 2 wherein, a distance from the second pixel at one end of the row of the second pixels to the second pixel at the other end is equal to or greater than an interval between the pixels formed at the ends of the facing sensor chips when the interval is the greatest within an operation temperature range of the plurality of sensor chips.

5. The light receiving unit according to claim 1,
wherein, towards the outside direction of each of the plurality of sensor chips in the longitudinal direction, one longitudinal end of a corresponding sensor chip has a first inclined side having an inclined shape from one side of the corresponding sensor chip in the longitudinal direction towards another side in the longitudinal direction;
towards the outside direction of the corresponding sensor chip in the longitudinal direction, the other longitudinal end of the corresponding sensor chip includes a second inclined side having an inclined shape from the other side towards the one side;
the ends of the facing sensor chips are arranged to be overlapped when the first inclined side of one of the corresponding sensor chip and the second inclined side of another sensor chip are seen through in the lateral direction perpendicular to the longitudinal direction;
the corresponding sensor chip includes a plurality of the pixels formed in a line on the one side in the longitudinal direction and a plurality of second pixels formed in a line on the other side in the longitudinal direction;
the second pixel on the side of the second inclined side among the plurality of second pixels overlaps with the pixel of the sensor chip when seen through in the lateral direction; and
the second pixel on the side of the first inclined side among the plurality of second pixels overlaps with the pixel of the facing sensor chip when seen through in the lateral direction.

6. The light receiving unit according to claim 5 wherein, a distance from the second pixel of one end of the row of the second pixel formed in a line to the second pixel of the other end is equal to or greater than an interval between the pixels formed at ends of the facing sensor chips when the interval is the greatest within the operation temperature range of the plurality of sensor chips.

7. The light receiving unit according to claim 2, further comprising an interpolation sensor chip arranged, adjacent in the lateral direction perpendicular to the longitudinal direction, to the facing ends of the facing sensor chips
wherein the interpolation sensor chip includes a plurality of second pixels formed in a line in the longitudinal direction; and
when the facing sensor chips and the interpolation sensor chip are seen through in the lateral direction, (i) a second pixel at one end of a row of the second pixel formed in a line and the pixel formed at one end of one of the plurality of sensor chips overlap, and (ii) the second pixel at another end of the row of the second pixel and the pixel formed at one end of another end of the plurality of sensor chips overlap.

8. The light receiving unit according to claim 3 wherein, a distance from the second pixel at one end of the row of the second pixels to the second pixel at the other end is equal to or greater than an interval between the pixels formed at the ends of the facing sensor chips when the interval is the greatest within an operation temperature range of the plurality of sensor chips.

9. The light receiving unit according to claim 2,
wherein, towards the outside direction of each of the plurality of sensor chips in the longitudinal direction, one longitudinal end of a corresponding sensor chip has a first inclined side having an inclined shape from one side of the corresponding sensor chip in the longitudinal direction towards another side in the longitudinal direction;
towards the outside direction of the corresponding sensor chip in the longitudinal direction, the other longitudinal end of the corresponding sensor chip includes a second inclined side having an inclined shape from the other side towards the one side;
ends of the facing sensor chips are arranged to be overlapped when the first inclined side of one of the corresponding sensor chip and the second inclined side of another sensor chip are seen through in the lateral direction perpendicular to the longitudinal direction;
the corresponding sensor chip includes a plurality of the pixels formed in a line on the one side in the longitudinal direction and a plurality of second pixels formed in a line on the other side in the longitudinal direction;
the second pixel on the side of the second inclined side among the plurality of second pixels overlaps with the pixel of the sensor chip when seen through in the lateral direction; and
the second pixel on the side of the first inclined side among the plurality of second pixels overlaps with the pixel of the facing sensor chip when seen through in the lateral direction.

10. The light receiving unit according to claim 8 wherein, a distance from the second pixel of one end of the row of the second pixel formed in a line to the second pixel of the other end is equal to or greater than an interval between the pixels formed at the ends of the facing sensor chips when the interval is the greatest within the operation temperature range of the plurality of sensor chips.

11. An image sensor comprising:
a light receiving unit according to claim 1; and
an imaging optical system to form an image of light reflected in a reading object or light transmitted through the reading object on the light receiving unit.

12. An image sensor comprising:
a light receiving unit according to claim 2; and
an imaging optical system to form an image of light reflected in a reading object or light transmitted through the reading object on the light receiving unit.

13. An image sensor comprising:
a light receiving unit according to claim 3; and
an imaging optical system to form an image of light reflected in a reading object or light transmitted through the reading object on the light receiving unit.

14. An image sensor comprising:
a light receiving unit according to claim 4; and
an imaging optical system to form an image of light reflected in a reading object or light transmitted through the reading object on the light receiving unit.

15. An image sensor comprising:
a light receiving unit according to claim 5; and
an imaging optical system to form an image of light reflected in a reading object or light transmitted through the reading object on the light receiving unit.

16. An image sensor comprising:
a light receiving unit according to claim 6; and
an imaging optical system to form an image of light reflected in a reading object or light transmitted through the reading object on the light receiving unit.

17. An image sensor comprising:
a light receiving unit according to claim 7; and
an imaging optical system to form an image of light reflected in a reading object or light transmitted through the reading object on the light receiving unit.

18. An image sensor comprising:
a light receiving unit according to claim 8; and
an imaging optical system to form an image of light reflected in a reading object or light transmitted through the reading object on the light receiving unit.

19. An image sensor comprising:
a light receiving unit according to claim 9; and
an imaging optical system to form an image of light reflected in a reading object or light transmitted through the reading object on the light receiving unit.

20. An image sensor comprising:
a light receiving unit according to claim 10; and
an imaging optical system to form an image of light reflected in a reading object or light transmitted through the reading object on the light receiving unit.

\* \* \* \* \*